United States Patent
Jeon et al.

(10) Patent No.: US 11,095,121 B2
(45) Date of Patent: Aug. 17, 2021

(54) ELECTROSTATIC DISCHARGE PROTECTION CIRCUIT HAVING VARIABLE SCHMITT TRIGGER CHARACTERISTICS

(71) Applicant: Samsung Electronics Co., Ltd., Suwon-si (KR)

(72) Inventors: Ju-Ho Jeon, Bucheon-si (KR); Jin-Hee Park, Seoul (KR); Hyuck-Joon Kwon, Yongin-si (KR)

(73) Assignee: Samsung Electronics Co., Ltd.

( * ) Notice: Subject to any disclaimer, the term of this patent is extended or adjusted under 35 U.S.C. 154(b) by 168 days.

(21) Appl. No.: 16/432,962

(22) Filed: Jun. 6, 2019

(65) Prior Publication Data
US 2020/0176980 A1  Jun. 4, 2020

(30) Foreign Application Priority Data
Dec. 4, 2018  (KR) .......................... 10-2018-0154695

(51) Int. Cl.
*H02H 9/04* (2006.01)
*H03K 3/3565* (2006.01)
*H02H 1/00* (2006.01)

(52) U.S. Cl.
CPC .......... *H02H 9/046* (2013.01); *H02H 1/0007* (2013.01); *H03K 3/3565* (2013.01)

(58) Field of Classification Search
CPC .... H02H 9/046; H02H 1/0007; H03K 3/3565; H03K 19/00315; H03K 19/00384; H03K 3/011; H03K 3/012
See application file for complete search history.

(56) References Cited

U.S. PATENT DOCUMENTS

| | | | |
|---|---|---|---|
| 5,978,192 A | 11/1999 | Young et al. | |
| 6,233,130 B1 | 5/2001 | Lin | |
| 6,919,602 B2 | 7/2005 | Lin et al. | |
| 8,645,895 B2 | 2/2014 | Bergmann et al. | |
| 8,824,111 B2 | 9/2014 | Pugsley et al. | |
| 8,879,222 B2 | 11/2014 | Singh | |
| 10,734,806 B2 * | 8/2020 | Zhao | H01L 27/0285 |
| 2003/0058591 A1 | 3/2003 | Johnson | |
| 2008/0106834 A1 | 5/2008 | Hung | |
| 2018/0269863 A1 * | 9/2018 | Suh | H02H 6/00 |

* cited by examiner

*Primary Examiner* — Kyle J Moody
(74) *Attorney, Agent, or Firm* — Myers Bigel, P.A.

(57) ABSTRACT

An electrostatic protection circuit with variable Schmitt trigger characteristics is provided. The electrostatic protection circuit uses a Schmitt trigger circuit to protect an integrated circuit against an overvoltage. The Schmitt trigger circuit includes first and second branches bridged between a power supply rail and a ground rail. The Schmitt trigger circuit operates with a narrow hysteresis width when the second branch is connected in parallel to the first branch and with a wide hysteresis width when the second branch is not connected in parallel to the first branch. The electrostatic protection circuit discharges an overvoltage of the power supply rail using a narrow hysteresis width when a weak overvoltage is applied to the power supply rail, and discharges an overvoltage of the power supply rail using a wide hysteresis width when a strong overvoltage is applied to the power supply rail.

20 Claims, 7 Drawing Sheets

ELECTROSTATIC DISCHARGE PROTECTION CIRCUIT HAVING VARIABLE SCHMITT TRIGGER CHARACTERISTICS

CROSS-REFERENCE TO RELATED APPLICATION

This application claims the benefit of Korean Patent Application No. 10-2018-0154695, filed on Dec. 4, 2018, in the Korean Intellectual Property Office, the disclosure of which is incorporated herein in its entirety by reference.

BACKGROUND

Electrostatic discharge (ESD) involves potentially destructive effects of large voltage transients. In order to protect integrated circuits against ESD, a transient-triggered ESD protection circuit, such as a power supply rail-coupled clamping circuit, is provided in various forms.

The clamping circuit may include a resistor, a capacitor, and a switching element connected in series between a power supply rail and a ground rail. When a sensed ESD pulse is coupled through the resistor and the capacitor and the switching element is turned on, a voltage applied across the clamping circuit may be clamped to a preset tolerable value. Finally, when the capacitor is charged with the voltage between the power supply rail and the ground rail, the clamping circuit may be turned off.

Values (i.e., an RC time constant) of the resistor and the capacitor of the clamping circuit and switching characteristics thereof control how long the clamping circuit is turned on. The RC time constant is typically designed such that the clamping circuit may be turned on for a time sufficient to discharge the entire ESD pulse.

However, in order to increase the RC time constant of the clamping circuit, the sizes of the resistor and the capacitor may increase. Thus, increases in sizes of the resistor and the capacitor may cause an increase in the chip size of a semiconductor device including the clamping circuit. Also, during a normal operation of the semiconductor device, rapid voltage transitions may appear across the clamping circuit. In this case, when the RC time constant is too high, the clamping circuit may be turned on by a rapid voltage transition peak. Thus an undesired problem may occur during the normal operation when the RC time constant is too high. Moreover, there may be oscillation issues where the clamping circuit is sensitive to noise near a triggering threshold of the clamping circuit, resulting in repeated turning on and off of the clamping circuit.

SUMMARY

The inventive concept relates to a semiconductor device, and more particularly, to an electrostatic discharge (ESD) protection circuit having Schmitt trigger characteristics that vary according to an overvoltage condition. The inventive concept also provides a method of protecting an integrated circuit against overvoltage conditions and an electrostatic discharge (ESD) protection circuit and a Schmitt trigger circuit, which each have variable trigger characteristics.

According to some embodiments of the inventive concept, there is provided a method of protecting an integrated circuit against an overvoltage condition, the method including monitoring a voltage level of a signal terminal affected by the overvoltage condition applied to a power supply rail connected to the integrated circuit, discharging the overvoltage condition of the power supply rail by conducting between the power supply rail and a ground rail across the integrated circuit for a first pulse width when the signal terminal is in a weak overvoltage state in which the voltage level of the signal terminal is equal to or less than a reference voltage, and discharging the overvoltage condition of the power supply rail by conducting between the power supply rail and the ground rail across the integrated circuit for a second pulse width that is greater than the first pulse width when the signal terminal is in a strong overvoltage state in which the voltage level of the signal terminal exceeds the reference voltage.

According to some embodiments of the inventive concept, there is provided a Schmitt trigger circuit having variable trigger characteristics. The Schmitt trigger circuit includes a first branch bridged between a power supply rail and a ground rail and connected between an input node and an output node, a second branch bridged between the power supply rail and the ground rail and selectively connected between the input node and the output node in response to a first control signal, a first PMOS transistor connected to a first connection node to which the first and second branches are connected. The first PMOS transistor is configured to drive the first connection node to a ground voltage in response to a voltage level of the output node. A first NMOS transistor is connected to a second connection node to which the first and second branches are connected. The first NMOS transistor is configured to drive the second connection node to a power supply voltage in response to a voltage level of the output node. A hysteresis width of the Schmitt trigger circuit is variable responsive to the second branch being selectively connected in parallel to the first branch.

According to some embodiments of the inventive concept, there is provided an electrostatic protection circuit including a clamping circuit connected between a power supply rail and a ground rail and configured to detect an overvoltage applied to the power supply rail, a Schmitt trigger circuit connected between the power supply rail and the ground rail and having variable trigger characteristics in response to a first control signal generated by an output of the clamping circuit and the overvoltage, and a switching circuit connected between the power supply rail and the ground rail and configured to discharge a current corresponding to the overvoltage to the ground rail in response to an output of the Schmitt trigger circuit.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings. It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below. As used herein, the term "and/or" includes any and all combinations of one or more of the associated listed items. Expressions such as "at least one of," when preceding a list of elements, modify the entire list of elements and do not modify the individual elements of the list.

Figure 1:
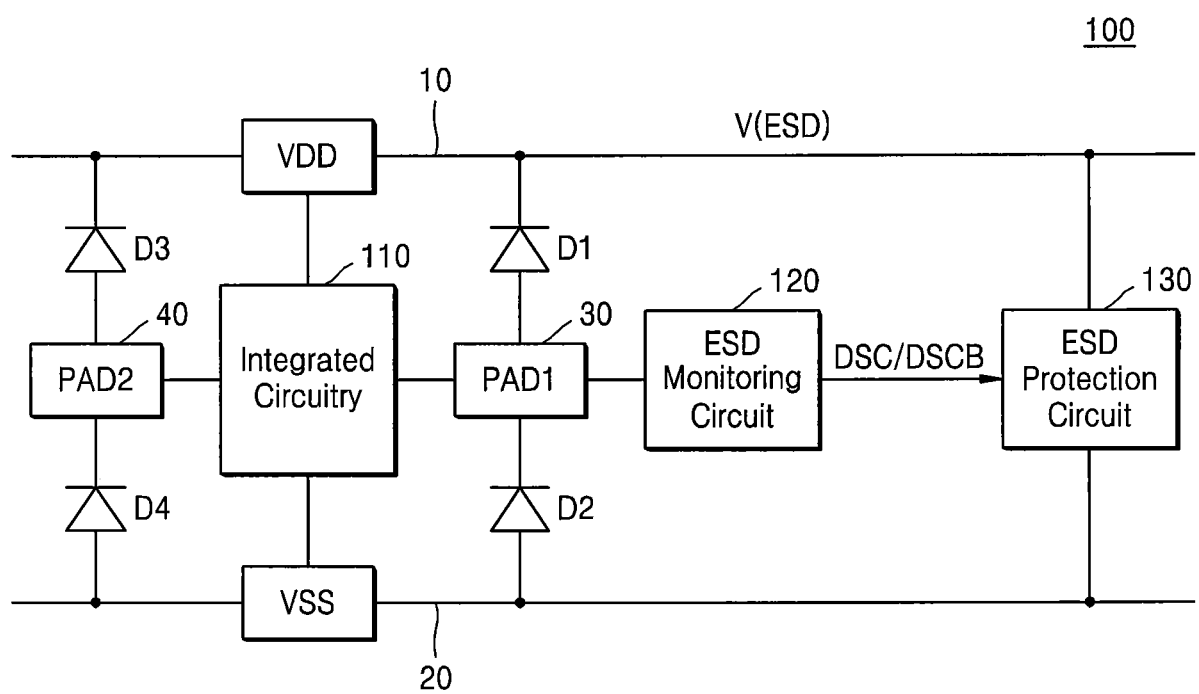
FIG. 1 is a block diagram of a semiconductor device according to some embodiments of the inventive concept.

FIG. 1 is a block diagram of a semiconductor device 100 according to some embodiments of the inventive concept.

Referring to FIG. 1, the semiconductor device 100 includes an integrated circuit 110, which performs operations according to the function and/or performance of the semiconductor device 100, and an electrostatic discharge (ESD) monitoring circuit 120 and an ESD protection circuit 130, which protect the integrated circuit 110 in response to ESD pulse states. The integrated circuit 110 is connected to and powered by a VDD rail 10 connected to a power supply (VDD) terminal and a VSS rail 20 connected to a ground (VSS) terminal. The integrated circuit 110 may be operated in response to signals input to and/or output from a first signal terminal 30 and a second signal terminal 40. Reverse-connected protection diodes D1 and D3 are connected between the first and second signal terminals 30 and 40 and the VDD rail 10, and reverse-connected protection diodes D2 and D4 are connected between the first and second signal terminals 30 and 40 and the VSS rail 20. It will be understood that, although the terms first, second, third, etc. may be used herein to describe various elements, and elements should not be limited by these terms; rather, these terms are only used to distinguish one element from another element. Thus, a first element discussed could be termed a second element without departing from the scope of the present inventive concepts.

The ESD protection circuit 130 is connected between the VDD rail 10 and the VSS rail 20 to protect the integrated circuit 110 against voltage transients or an ESD pulse voltage V(ESD). The ESD protection circuit 130 operates such that the voltage across the VDD rail 10 and the VSS rail 20 is clamped to a predetermined allowable value in response to first and second control signals DSC and DSCB. The ESD protection circuit 130 performs an operation of discharging a current corresponding to the ESD pulse voltage V(ESD) applied to the VDD rail 10 to the VSS rail 20.

The ESD monitoring circuit 120 is connected to the first signal terminal 30 and may output the first and second control signals DSC and DSCB according to the voltage level of the first signal terminal 30. The first signal terminal 30 may be a terminal to which a signal sensitive to ESD is applied among a plurality of signal terminals provided in the semiconductor device 100. For example, the first signal terminal 30 may be one of data input/output signal (DQ) terminals. The ESD monitoring circuit 120 may monitor a voltage level, which occurs at the first signal terminal 30 when the ESD pulse voltage V(ESD) is applied to the VDD rail 10, and output the first and second control signals DSC and DSCB.

According to some embodiments, the first signal terminal 30 may be a separate signal terminal for sensing ESD.

In some embodiments, the ESD monitoring circuit 120 and the ESD protection circuit 130 may be separated from each other. However, the inventive concept is not limited thereto, and the ESD monitoring circuit 120 may be included in the ESD protection circuit 130, in some embodiments.

Figure 2:
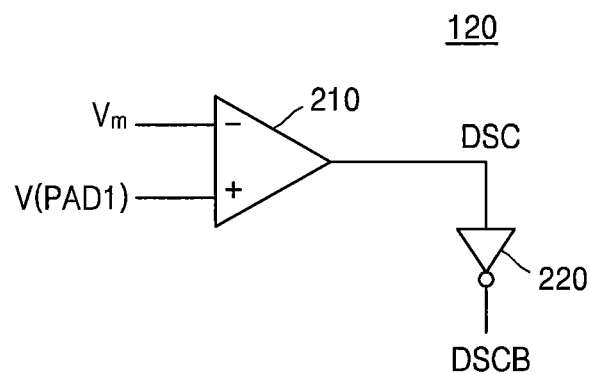
FIG. 2 is a circuit diagram of an example of an electrostatic discharge (ESD) monitoring circuit in FIG. 1, according to some embodiments of the inventive concept.

FIG. 2 is a circuit diagram of an example of the ESD monitoring circuit 120 in FIG. 1.

Referring to FIG. 2, the ESD monitoring circuit 120 may include a comparator 210 and an inverter 220. The comparator 210 may compare a reference voltage Vm with a voltage V(PAD1) of the first signal terminal 30 and output the first control signal DSC as a comparison result. The reference voltage Vm may be provided from a voltage generator associated with the integrated circuit 110. The inverter 220 may receive the first control signal DSC and output the second control signal DSCB. The first control signal DSC and the second control signal DSCB have complementary logic levels.

The level of the reference voltage Vm may be set higher than the level of the voltage V(PAD1) of the first signal terminal 30 as a default setting when the semiconductor device 100 is powered up. Accordingly, the first control signal DSC may be at a logic low level, and the second control signal DSCB may be at a logic high level. However, these levels serve as non-limiting examples, and the first control signal DSC and the second control signal DSCB may be set to different and/or opposite logic levels to those described above.

A transient voltage may be applied to the VDD rail 10. However, the level of the voltage V(PAD1) of the first signal terminal 30 of the ESD monitoring circuit 120 may be lower than the level of the reference voltage Vm. That is, a relatively weak ESD voltage condition may occur in the VDD rail 10. In this case, the first control signal DSC may be maintained at a logic low level, and the second control signal DSCB may be maintained at a logic high level. In some embodiments, a state in which the transient voltage is applied to the VDD rail 10 where the first control signal DSC is maintained at a logic low level and the second control signal DSCB is maintained at a logic high level may be referred to as a weak transient voltage state.

When a relatively strong transient voltage or ESD voltage condition occurs in the VDD rail 10, such as, when the ESD pulse voltage V(ESD) is applied to the VDD rail 10, the level of the voltage V(PAD1) of the first signal terminal 30 may rise due to the influence of the ESD pulse voltage V(ESD). When the level of the voltage V(PAD1) of the first signal terminal 30 becomes higher than the level of the reference voltage Vm, the level of the first control signal DSC may be changed from a logic low level to a logic high level and/or the level of the second control signal DSCB may be changed from a logic high level to a logic low level.

Figure 3:
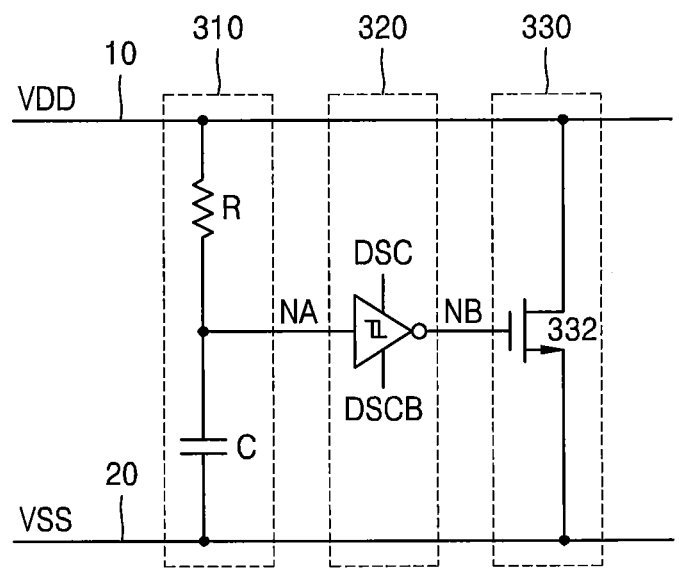
FIG. 3 is a circuit diagram of an ESD protection circuit in FIG. 1, according to some embodiments of the inventive concept.

FIG. 3 is a circuit diagram of the ESD protection circuit 130 in FIG. 1.

Referring to FIG. 3, the ESD protection circuit 130 may include a clamping circuit 310 and a switching circuit 330, connected between the VDD rail 10 and the VSS rail 20. A Schmitt trigger circuit 320 is connected between the clamping circuit 310 and the switching circuit 330.

The clamping circuit 310 includes a resistor R and a capacitor C, connected in series between the VDD rail 10 and the VSS rail 20. The clamping circuit 310 may allow the voltage between the VDD rail 10 and the VSS rail 20 to be clamped to a predetermined allowable value, i.e., a VDD voltage level.

During operation of the clamping circuit 310, when the ESD pulse voltage V(ESD) is not applied to the VDD rail 10, a first connection node NA between the resistor R and the capacitor C has a VDD voltage level. However, when the ESD pulse voltage V(ESD) is applied to the VDD rail 10, the capacitor C may be almost instantaneously short-circuited. Accordingly, charges charged in the first connection node NA are discharged to a VSS voltage, and thus, the voltage level of the first connection node NA transits to a VSS voltage level. The first connection node NA is an output node of the clamping circuit 310 and is connected to the Schmitt trigger circuit 320.

The Schmitt trigger circuit 320 is connected between the first connection node NA and a second connection node NB. The Schmitt trigger circuit 320 may have a trigger characteristic that is variable with respect to the voltage of the first connection node NA in response to the first and second control signals DSC and DSCB output from the ESD monitoring circuit 120.

The switching circuit 330 may discharge a current corresponding to the ESD pulse voltage V(ESD) applied to the VDD rail 10 to the VSS rail 20. The switching circuit 330 may be implemented with an NMOS transistor 332 connected between the VDD rail 10 and the VSS rail 20. The gate of the NMOS transistor 332 is connected to the second connection node NB, which is an output node of the Schmitt trigger circuit 320.

Figure 4:
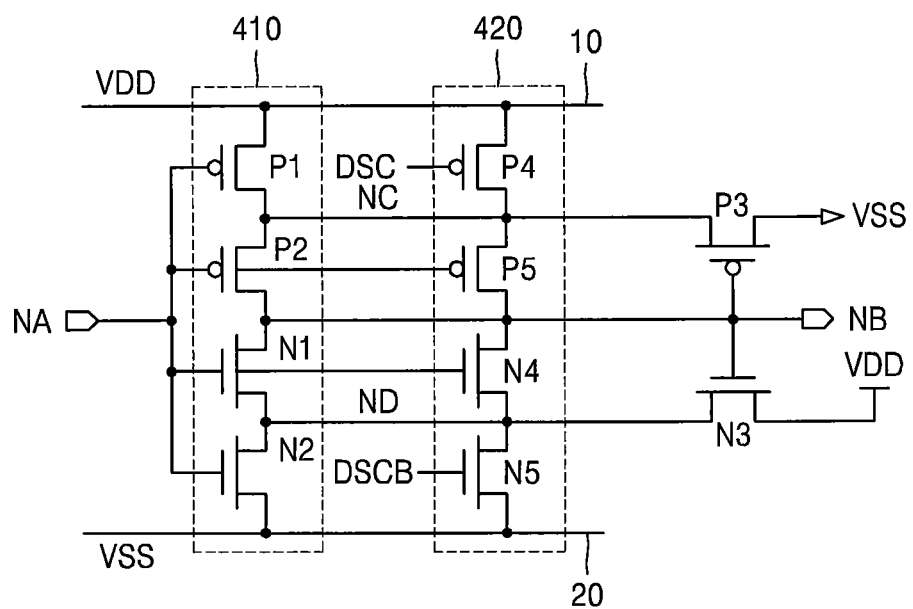
FIG. 4 is a circuit diagram of an example of a Schmitt trigger circuit in FIG. 3, according to some embodiments of the inventive concept.
Figure 5:
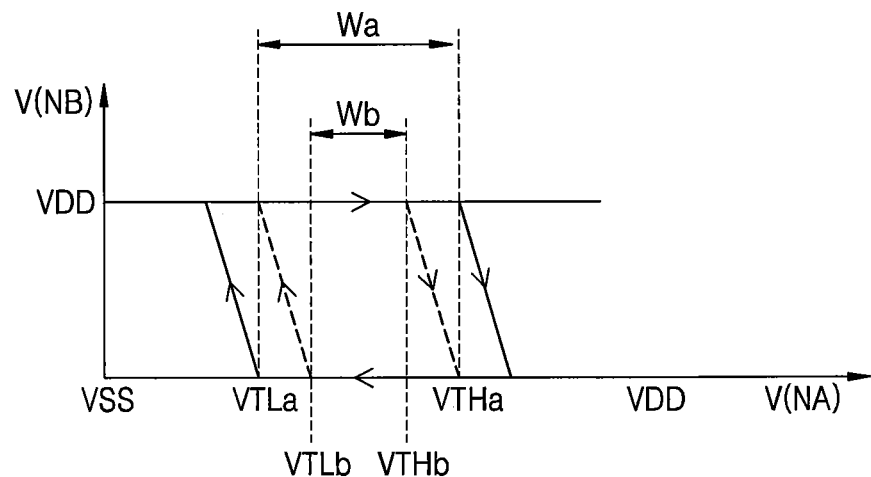
FIG. 5 is an operation graph of an example of the Schmitt trigger circuit in FIG. 3, according to some embodiments of the inventive concept.

FIG. 4 is a circuit diagram of the Schmitt trigger circuit 320 in FIG. 3, and FIG. 5 is an operation graph of the Schmitt trigger circuit 320.

Referring to FIG. 4, the Schmitt trigger circuit 320 may include a first branch 410 and a second branch 420, bridged between the VDD rail 10 and the VSS rail 20, and a third PMOS transistor P3 connected to the VSS rail 20 and a third NMOS transistor N3 connected to the VDD rail 10. Two elements may be bridged if they are electrically or logically connected together.

The first branch 410 may include first and second PMOS transistors P1 and P2 and first and second NMOS transistors N1 and N2, connected in series between the VDD rail 10 and the VSS rail 20. The gates of the first and second PMOS transistors P1 and P2 and the first and second NMOS transistors N1 and N2 are connected to the first connection node NA of the clamping circuit 310. A third connection node NC between the first PMOS transistor P1 and the second PMOS transistor P2 is connected to the third PMOS transistor P3, and a fourth connection node ND between the first NMOS transistor N1 and the second NMOS transistor N2 is connected to the third NMOS transistor N3. A connection point between the second PMOS transistor P2 and the first NMOS transistor N1 is an output node of the Schmitt trigger circuit 320 as the second connection node NB.

The third PMOS transistor P3 is connected between the third connection node NC and the VSS rail 20, and the gate of the third PMOS transistor P3 is connected to the second connection node NB. The third NMOS transistor N3 is connected between the fourth connection mode ND and the VDD rail 10, and the gate of the third NMOS transistor N3 is also connected to the second connection node NB.

In the Schmitt trigger circuit 320, the operations of the first branch 410 and the third PMOS and NMOS transistors P3 and N3 may be as follows.

As an example, it may be assumed that the voltage level of the first connection node NA, output from the clamping circuit 310 (see FIG. 3), is a VDD voltage level. The first and second PMOS transistors P1 and P2 are turned off and the first and second NMOS transistors N1 and N2 are turned on, in response to the VDD voltage level of the first connection node NA, and thus, the second connection node NB has a VSS voltage level. The third PMOS transistor P3 is turned on in response to the VSS voltage level of the second connection node NB, and thus, the third connection node NC is at the VSS voltage level.

The potential at the third connection node NC, which is the source of the second PMOS transistor P2, and the second connection node NB, which is the drain of the second PMOS transistor P2, may be equal to a VSS voltage level. In this case, even if the voltage level of the first connection node NA gradually decreases from a VDD voltage level to a first trigger level VTLa (see FIG. 5), the second PMOS transistor P2 maintains a turn-off state, and thus, the second connection node NB may maintain the VSS voltage level.

The first trigger level VTLa may be determined by adjusting the sizes of the second PMOS transistor P2 and the third PMOS transistor P3. For example, when the size of the third PMOS transistor P3 is relatively greater than the size of the second PMOS transistor P2, the first trigger level VTLa may decrease, and when the size of the second PMOS transistor P2 is relatively greater than the size of the third PMOS transistor P3, the first trigger level VTLa may tend to increase toward a third trigger level VTLb.

Next, it may be assumed that the voltage level of the first connection node NA output from the clamping circuit 310 (see FIG. 3) is a VSS voltage level. The first and second NMOS transistors N1 and N2 are turned off and the first and second PMOS transistors P1 and P2 are turned on, in response to the VSS voltage level of the first connection node NA, and thus, the second connection node NB has a VDD voltage level. The third NMOS transistor N3 is turned on in response to the VDD voltage level of the second connection node NB, and thus, the fourth connection node ND is at the VDD voltage level.

Here, the potentials of the fourth connection node ND, which is the source of the first NMOS transistor N1, and the second connection node NB, which is the drain of the first NMOS transistor N1, may be equal to a VDD voltage level. In this case, even if the voltage level of the first connection node NA gradually increases from a VSS voltage level to a second trigger level VTHa (see FIG. 5), the first NMOS transistor N1 maintains a turn-off state, and thus, the second connection node NB may maintain the VDD voltage level.

The second trigger level VTHa may be determined by adjusting the sizes of the first NMOS transistor N1 and the third NMOS transistor N3. For example, when the size of the third NMOS transistor N3 is relatively greater than the size of the first NMOS transistor N1, the second trigger level VTHa may increase, and when the size of the first NMOS transistor N1 is relatively greater than the size of the third NMOS transistor N3, the second trigger level VTHa may tend to decrease toward a fourth trigger level VTHb.

The second branch 420 may be used to change the first and second trigger levels VTLa and VTHa determined by the first branch 410 and the third PMOS and NMOS transistors P3 and N3 to the third and fourth trigger levels VTLb and VTHb. Conversely, the second branch 420 may be used to change the third and fourth trigger levels VTLb and VTHb to the first and second trigger levels VTLa and VTHa.

The second branch 420 may include fourth and fifth PMOS transistors P4 and P5 and fourth and fifth NMOS transistors N4 and N5, connected in series between the VDD rail 10 and the VSS rail 20. The gate of the fourth PMOS transistor P4 is connected to the first control signal DSC output from the ESD monitoring circuit 120, the gates of the fifth PMOS transistor P5 and the fourth NMOS transistor N4 are connected to the first connection node NA, and the gate of the fifth NMOS transistor N5 is connected to the second control signal DSCB output from the ESD monitoring circuit 120. A connection point between the fourth PMOS transistor P4 and the fifth PMOS transistor P5 is connected to the third connection node NC, and a connection point between the fourth NMOS transistor N4 and the fifth NMOS transistor N5 is connected to the fourth connection node ND. A connection point between the fifth PMOS transistor P5 and the fourth NMOS transistor N4 is connected to the second connection node NB.

The first control signal DSC and the second control signal DSCB output from the ESD monitoring circuit 120 may be set to a logic low level and a logic high level, respectively, as a default setting at power-up of the semiconductor device 100. The fourth PMOS transistor P4 is turned on in response to the first control signal DSC having a logic low level and the fifth NMOS transistor N5 is turned on in response to a second control signal DSCB having a logic high level. As the fourth PMOS transistor P4 and the fifth NMOS transistor N5 are turned on, the second branch 420 is enabled. When the second branch 420 is enabled, the fifth PMOS transistor P5 forms a parallel connection structure with the second PMOS transistor P2 of the first branch 410, and the fourth NMOS transistor N4 forms a parallel connection structure with the first NMOS transistor N1 of the first branch 410.

As described above, in the operation of the first branch 410 and the third PMOS and NMOS transistors P3 and N3, when the voltage level of the first connection node NA falls from a VDD voltage level to a VSS voltage level, the first trigger level VTLa may be determined by adjusting the sizes of the second PMOS transistor P2 and the third PMOS transistor P3. When the fifth PMOS transistor P5 is connected in parallel to the second PMOS transistor P2, the size of the second PMOS transistor P2 increases by the size of the fifth PMOS transistor P5. That is, the size of the second PMOS transistor P2 becomes relatively greater than that of the third PMOS transistor P3. In this case, the Schmitt trigger circuit 320 may be triggered at the third trigger level VTLb when the voltage level of the first connection node NA falls from a VDD voltage level to a VSS voltage level.

Similarly, as described above, in the operation of the first branch 410 and the third PMOS and NMOS transistors P3 and N3, when the voltage level of the first connection node NA rises from a VSS voltage level to a VDD voltage level, the second trigger level VTHa is determined by adjusting the sizes of the first NMOS transistor N1 and the third NMOS transistor N3. When the fourth NMOS transistor N4 is connected in parallel to the first NMOS transistor N1, the size of the first NMOS transistor N1 increases by the size of the fourth NMOS transistor N4. That is, the size of the first NMOS transistor N1 becomes relatively greater than that of the third NMOS transistor N3. In this case, the Schmitt trigger circuit 320 may be triggered at the fourth trigger level VTHb when the voltage level of the first connection node NA rises from a VSS voltage level to a VDD voltage level.

A first hysteresis width Wa between the first trigger level VTLa and the second trigger level VTHa may be determined according to the operations of the first branch 410 and the third PMOS and NMOS transistors P3 and N3 of the Schmitt trigger circuit 320. A second hysteresis width Wb between the third trigger level VTLb and the fourth trigger level VTHb may be determined according to the operations of the first branch 410, the second branch 420, and the third PMOS and NMOS transistors P3 and N3. The first hysteresis width W1 may be greater than the second hysteresis width W2, as shown in FIG. 5. The hysteresis characteristic of the Schmitt trigger circuit 320 varies with the first hysteresis width W1 and the second hysteresis width W2 depending on whether the second branch 420 is operated or not. That is, when the second branch 420 is enabled, the Schmitt trigger circuit 320 has the second hysteresis width W2, and when the second branch 420 is disabled, the Schmitt trigger circuit 320 has the first hysteresis width W1.

Figure 6:
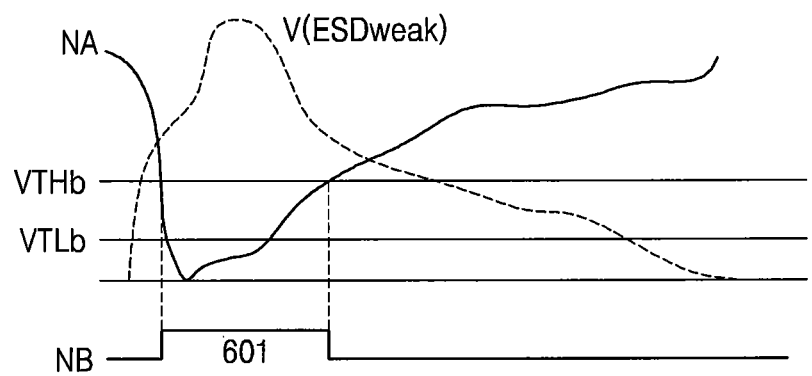
FIGS. 6 and 7 are waveform diagrams illustrating the operation of the ESD protection circuit of FIG. 3, according to some embodiments of the inventive concept.
Figure 7:
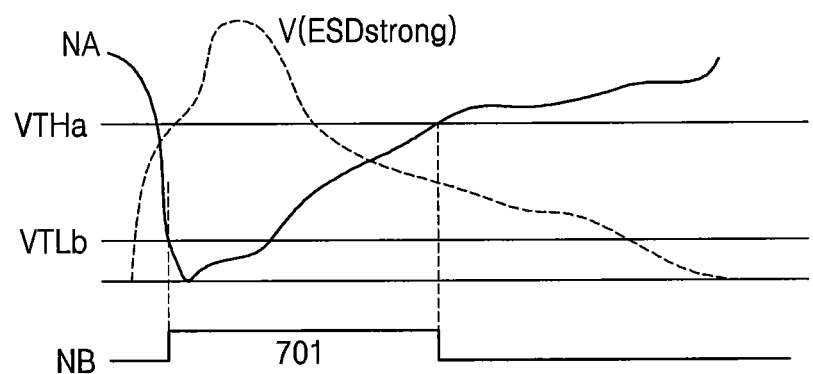

FIGS. 6 and 7 are waveform diagrams illustrating the operation of the ESD protection circuit 130 of FIG. 3. FIG. 6 illustrates the operation of the ESD protection circuit 130 when a relatively weak ESD voltage condition occurs on the VDD rail 10 of the semiconductor device 100 of FIG. 1, and FIG. 7 illustrates the operation of the ESD protection circuit 130 when a relatively strong ESD voltage condition occurs on the VDD rail 10.

Referring to FIG. 6 in conjunction with FIGS. 1 to 5, when a relatively weak ESD voltage condition occurs on the VDD rail 10, the first control signal DSC output from the ESD monitoring circuit 120 is at a logic low level and the second control signal DSCB output from the ESD monitoring circuit 120 is at a logic high level.

In response to the first control signal DSC at a logic low level and the second control signal DSCB at a logic high level, the second branch 420 of the Schmitt trigger circuit 320 may be enabled. The fifth PMOS transistor P5 of the second branch 420 may be connected in parallel to the second PMOS transistor P2 of the first branch 410, and the fourth NMOS transistor N4 of the second branch 420 may be connected in parallel to the first NMOS transistor N1 of the first branch 410. Accordingly, the Schmitt trigger circuit 320 has the second hysteresis width W2 between the third trigger level VTLb and the fourth trigger level VTHb.

The Schmitt trigger circuit 320 is triggered at the third trigger level VTLb to output a logic high level to the second connection node NB when the voltage of the first connection node NA, output from the clamping circuit 310, falls from a VDD voltage level to a VSS voltage level. The Schmitt trigger circuit 320 is triggered at the fourth trigger level VTHb to output a logic high level to the second connection node NB when the voltage of the first connection node NA rises from a VSS voltage level to a VDD voltage level.

Accordingly, a signal on the second connection node NB, output from the Schmitt trigger circuit 320, has a logic high level pulse 601.

The logic high level pulse 601 of the second connection node NB is provided to the switching circuit 330 and turns on the NMOS transistor 332. A current corresponding to the ESD pulse voltage V(ESD) applied to the VDD rail 10 through the NMOS transistor 332 that is turned on may be discharged to the VSS rail 20.

Referring to FIG. 7 in conjunction with FIGS. 1 to 5, when a relatively strong ESD voltage condition occurs on the VDD rail 10, the first control signal DSC output from the ESD monitoring circuit 120 is at a logic high level and the second control signal DSCB output from the ESD monitoring circuit 120 is at a logic low level.

In response to the first control signal DSC at a logic high level and the second control signal DSCB at a logic low level, the second branch 420 of the Schmitt trigger circuit 320 may be disabled. Accordingly, the Schmitt trigger circuit 320 has the first hysteresis width W1 between the first trigger level VTLa and the second trigger level VTHa according to the operations of the first branch 410 and the third PMOS and NMOS transistors P3 and N3.

The Schmitt trigger circuit 320 is triggered at the first trigger level VTLa to output a logic high level to the second connection node NB when the voltage of the first connection node NA output from the clamping circuit 310 falls from a VDD voltage level to a VSS voltage level. The Schmitt trigger circuit 320 is triggered at the second trigger level VTHa to output a logic low level to the second connection node NB when the voltage of the first connection node NA rises from a VSS voltage level to a VDD voltage level. Accordingly, a signal on the second connection node NB output from the Schmitt trigger circuit 320 has a logic high level pulse 701.

The logic high level pulse 701 of the second connection node NB is provided to the switching circuit 330 and turns on the NMOS transistor 332. A current corresponding to the ESD pulse voltage V(ESD) applied to the VDD rail 10 through the NMOS transistor 332 that is turned on may be discharged to the VSS rail 20.

Referring to FIGS. 6 and 7, the logic high level pulse 701 of the second connection node NB, which occurs when a relatively strong ESD voltage condition occurs on the VDD rail 10, has a longer pulse width than the logic high level pulse 601 of the second connection node NB, which occurs when a relatively weak ESD voltage condition occurs on the VDD rail 10. A time during which the NMOS transistor 332 of the switching circuit 330 is turned on may increase in response to a long logic high level pulse width of the second connection node NB under the strong ESD voltage condition. Accordingly, a current corresponding to a strong ESD applied to the VDD rail 10 may be sufficiently discharged to the VSS rail 20 during the long logic high level pulse width of the second connection node NB.

Figure 8:
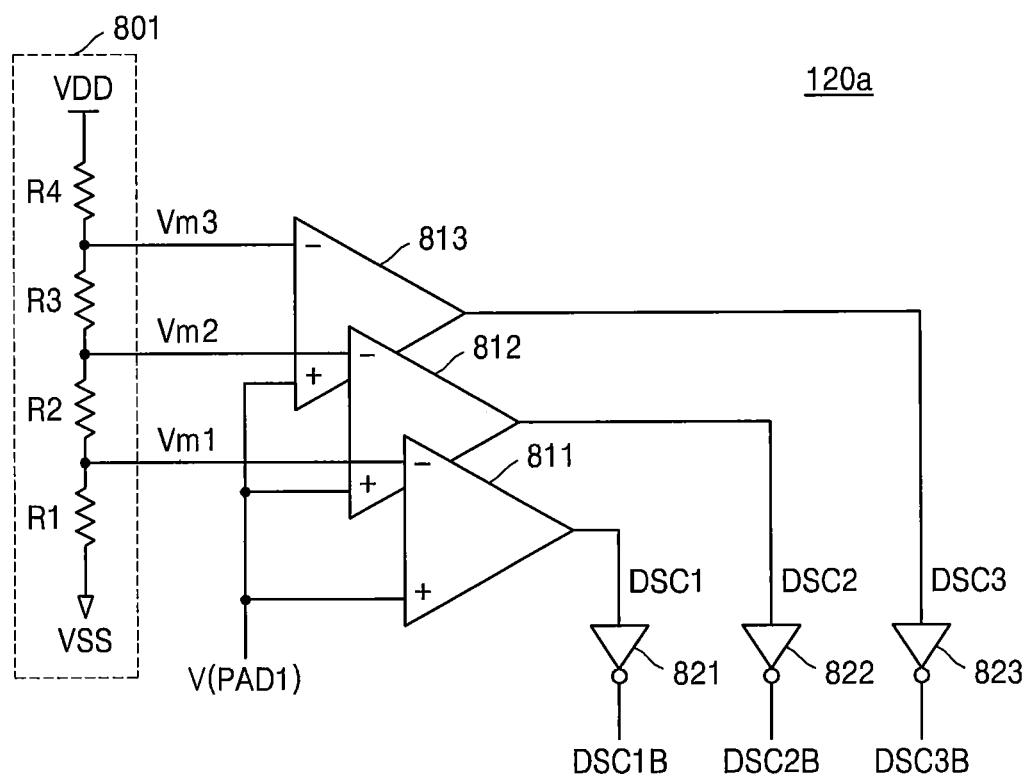
FIG. 8 is a circuit diagram of an example of the ESD monitoring circuit in FIG. 1, according to some embodiments of the inventive concept.

FIG. 8 is a circuit diagram of an example of the ESD monitoring circuit 120 in FIG. 1.

Referring to FIG. 8, an ESD monitoring circuit 120a according to the second example includes a reference voltage generator 801, first to third comparators 811 to 813, and first to third inverters 821 to 823. The reference voltage generator 801 may include a voltage divider including a plurality of resistors R1 to R4 connected in series between a VDD voltage and a VSS voltage. The voltages across each of the plurality of resistors R1 to R4 may be output as first to third reference voltages Vm1, Vm2, and Vm3. The first reference voltage Vm1 may be the lowest voltage among the first to third reference voltages Vm1, Vm2, and Vm3, and the third reference voltage Vm3 may be the highest voltage among the first to third reference voltages Vm1, Vm2, and Vm3.

As an example, when the plurality of resistors R1 to R4 have the same resistance value, the first to third reference voltages Vm1, Vm2, and Vm3 may have an equal voltage difference. As another example, when the plurality of resistors R1 to R4 have different resistance values, the first to third reference voltages Vm1, Vm2, and Vm3 may have different voltage differences.

The first to third comparators 811 to 813 may compare the first to third reference voltages Vm1, Vm2, and Vm3 with a voltage V(PAD1) of a first signal terminal 30, and output first to third control signals DSC1 to DSC3 as comparison results. The first to third inverters 821 to 823 may receive the first to third control signals DSC1 to DSC3, respectively, and output fourth to sixth control signals DSCB1 to DSCB3. The first control signal DSC1 and the fourth control signal DSCB1 have complementary logic levels, the second control signal DSC2 and the fifth control signal DSCB2 have complementary logic levels, and the second control signal DSC3 and the sixth control signal DSCB3 have complementary logic levels. The ESD monitoring circuit 120a described in this embodiment generates three control signal pairs DSC1/DSCB1, DSC2/DSCB2, and DSC3/DSCB3 by using three reference voltages, i.e., the first to third reference signals Vm1, Vm2, and Vm3 However, the inventive concept is not limited thereto and various numbers of control signal pairs may be generated by using various numbers of reference voltages.

Figure 9:
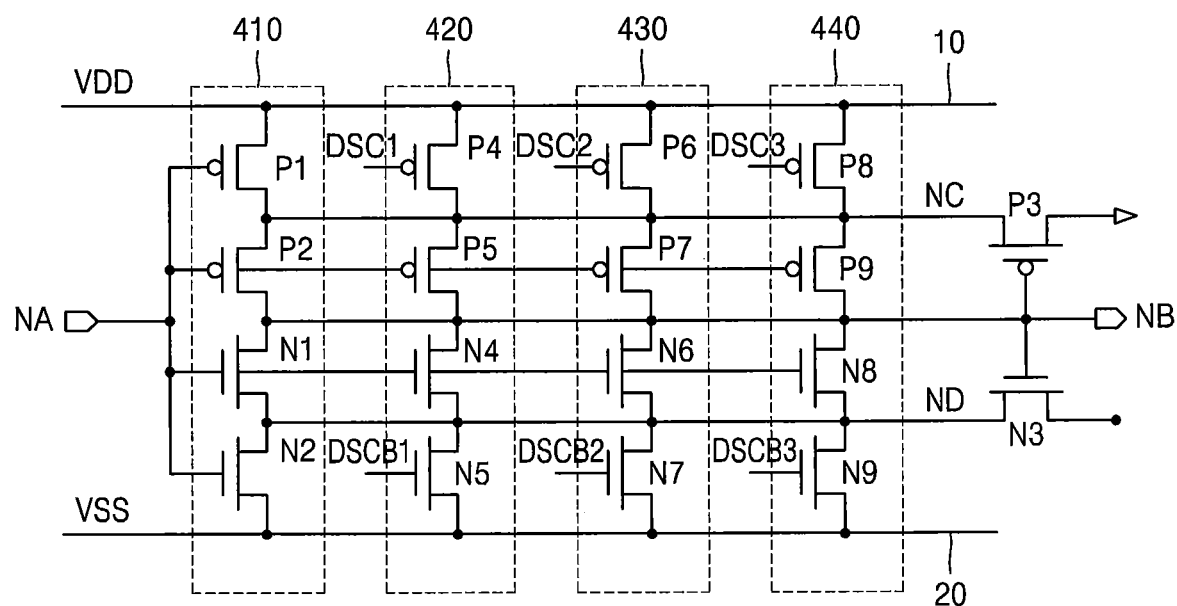
FIG. 9 is a circuit diagram of an example of the Schmitt trigger circuit in FIG. 3, according to some embodiments of the inventive concept.
Figure 10:
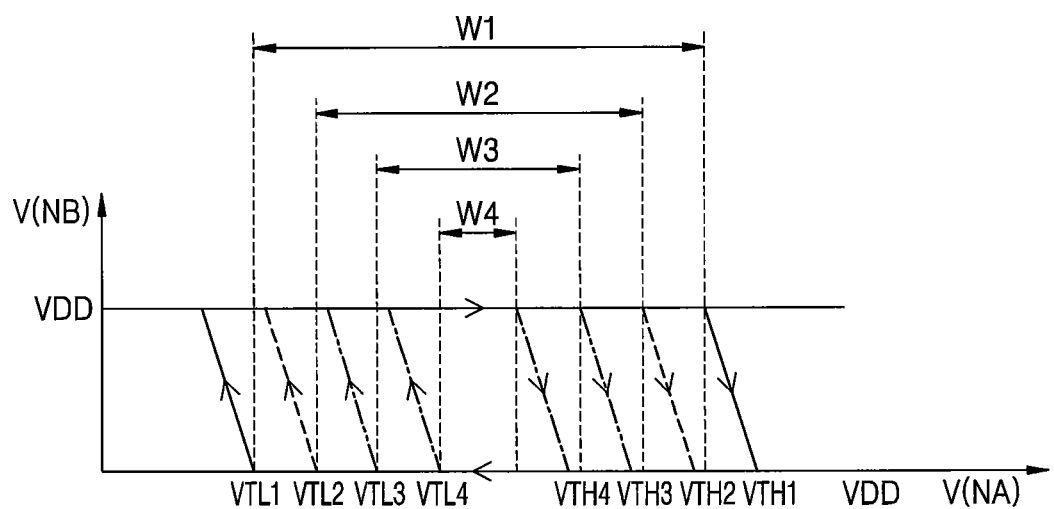
FIG. 10 is an operation graph of an example of the Schmitt trigger circuit in FIG. 3, according to some embodiments of the inventive concept.

FIG. 9 is a circuit diagram of the example of the Schmitt trigger circuit 320 in FIG. 3, and FIG. 10 is an operation graph of the example of the Schmitt trigger circuit 320.

Referring to FIG. 9, a Schmitt trigger circuit 320a according to the second example includes the same elements as the Schmitt trigger circuit 320 of FIG. 4, except for a third branch 430 and a fourth branch 440. Hereinafter, repeated descriptions are omitted.

The Schmitt trigger circuit 320a includes a first branch 410, a second branch 420, the third branch 430, and the fourth branch 440, bridged between the VDD rail 10 and the VSS rail 20, and a third PMOS transistor P3 connected to the VSS rail 20 and a third NMOS transistor N3 connected to the VDD rail 10.

The gate of a fourth PMOS transistor P4 of the second branch 420 is connected to the first control signal DSC1 output from the ESD monitoring circuit 120a of FIG. 8, and the gate of a fifth NMOS transistor N5 is connected to the fourth control signal DSCB1 output from the ESD monitoring circuit 120a.

The third branch 430 may include sixth and seventh PMOS transistors P6 and P7 and sixth and seventh NMOS transistors N6 and N7, connected in series between the VDD rail 10 and the VSS rail 20. The gate of the sixth PMOS transistor P6 is connected to the second control signal DSC2 output from the ESD monitoring circuit 120a, the gates of the seventh PMOS transistor P7 and the sixth NMOS transistor N6 are connected to the first connection node NA, and the gate of the seventh NMOS transistor N7 is connected to the fifth control signal DSCB2 output from the ESD monitoring circuit 120a. A connection point between the sixth PMOS transistor P6 and the seventh PMOS transistor P7 is connected to a third connection node NC, and a connection point between the sixth NMOS transistor N6 and the seventh NMOS transistor N7 is connected to a fourth connection point ND. A connection point between the seventh PMOS transistor P7 and the sixth NMOS transistor N6 is connected to the second connection node NB.

The fourth branch 440 may include eighth and ninth PMOS transistors P8 and P9 and eighth and ninth NMOS transistors N8 and N9, connected in series between the VDD rail 10 and the VSS rail 20. The gate of the eighth PMOS transistor P8 is connected to the third control signal DSC3 output from the ESD monitoring circuit 120a, the gates of the ninth PMOS transistor P9 and the eighth NMOS transistor N8 are connected to the first connection node NA, and the gate of the ninth NMOS transistor N9 is connected to the sixth control signal DSCB3 output from the ESD monitoring circuit 120a. A connection point between the eighth PMOS transistor P8 and the ninth PMOS transistor P9 is connected to the third connection node NC and a connection point between the eighth NMOS transistor N8 and the ninth NMOS transistor N9 is connected to the fourth connection node ND. A connection point between the ninth PMOS transistor P9 and the eighth NMOS transistor N8 is connected to the second connection node NB.

In the Schmitt trigger circuit 320a, the second to fourth branches 420, 430, and 440 may be selectively enabled or disabled in response to the first to third control signals DSCB1 to DSCB3 and the fourth to sixth control signals DSCB1 to DSCB3, output from the ESD monitoring circuit 120a. The first to third control signals DSC1 to DSC3 and the fourth to sixth control signals DSCB1 to DSCB3 are dominant in the Schmitt trigger circuit 320a. Thus, the Schmitt trigger circuit 320a may have the following variable Schmitt trigger characteristics by the second to fourth branches 420, 430, and 440 that are selectively enabled or disabled in response to ESD pulse voltage states.

First, as a default setting when the semiconductor device 100 is powered up, the first reference voltage Vm1 may be higher than the voltage V(PAD1) of the first signal terminal 30. The first to third control signals DSC1 to DSC3 may be output at a logic low level and the fourth to sixth control signals DSCB1 to DSCB3 may be output at a logic high level, and thus, the second to fourth branches 420, 430, and 440 may be enabled.

The first branch 410 and the second to fourth branches 420, 430 and 440 may be connected in parallel, the sizes of the second, fifth, seventh, and ninth PMOS transistors P2, P5, P7, and P9 connected in parallel may be much greater than the size of the third PMOS transistor P3, and the sizes of the first, fourth, sixth, and eighth NMOS transistor N1, N4, N6, and N8 may be much greater than the size of the third NMOS transistor N3. Accordingly, as shown in FIG. 10, the Schmitt trigger circuit 320a may be triggered at a fourth low trigger level VTL4 when the voltage level of the first connection node NA falls from a VDD voltage level to a VSS voltage level and may be triggered at a fourth high trigger level VTH4 when the voltage level of the first connection node NA rises from a VSS voltage level to a VDD voltage level. Accordingly, the Schmitt trigger circuit 320a may have a hysteresis width W4 between the fourth low trigger level VTL4 and the fourth high trigger level VTH4.

Secondly, the voltage V(PAD1) of the first signal terminal 30 may be generated by the influence of an ESD pulse voltage applied to the VDD rail 10 of the semiconductor device 100 (see FIG. 1). When the voltage V(PAD1) of the first signal terminal 30 is higher than the first reference voltage Vm1 and lower than the second reference voltage Vm2, in the ESD monitoring circuit 120a, the first control signal DSC1 may be output at a logic high level, the fourth control signal DSCB1 may be output at a logic low level, the second and third control signals DSC2 and DSC3 may be output at a logic low level, and the fifth and sixth control signals DSCB2 and DSCB3 may be output at a logic high level. Thus, the second branch 420 may be disabled and the third and fourth branches 430 and 440 may be enabled.

The first branch 410 and the third and fourth branches 430 and 440 may be connected in parallel. The sizes of the second, seventh, and ninth PMOS transistors P2, P7, and P9 connected in parallel may be greater than the size of the third PMOS transistor P3, and the sizes of the first, sixth, and eighth NMOS transistor N1, N6, and N8 may be greater than the size of the third NMOS transistor N3. Accordingly, as shown in FIG. 10, the Schmitt trigger circuit 320a may be triggered at a third low trigger level VTL3 when the voltage level of the first connection node NA falls from a VDD voltage level to a VSS voltage level and may be triggered at a third high trigger level VTH3 when the voltage level of the first connection node NA rises from a VSS voltage level to a VDD voltage level. Accordingly, the Schmitt trigger circuit 320a may have a hysteresis width W3 between the third low trigger level VTL3 and the third high trigger level VTH3.

Third, when the voltage V(PAD1) of the first signal terminal 30 is higher than the second reference voltage Vm2 and lower than the third reference voltage Vm3 due to the influence of an ESD pulse voltage applied to the VDD rail 10, in the ESD monitoring circuit 120a, the first and second control signals DSC1 and DSC2 may be output at a logic high level, the fourth and fifth control signals DSCB1 and DSCB2 may be output at a logic low level, the second and third control signals DSC2 and DSC3 may be output at a logic low level, and the fifth and sixth control signals DSCB2 and DSCB3 may be output at a logic high level, and thus, the second and third branches 420 and 430 may be disabled and the fourth branch 440 may be enabled.

The first branch 410 and the fourth branch 440 may be connected in parallel, the sizes of the second and ninth PMS transistors P2 and P9 connected in parallel may be greater than the size of the third PMOS transistor P3, and the sizes of the first and eighth NMOS transistors N1 and N8 connected in parallel may be greater than the size of the third NMOS transistor N3. Accordingly, as shown in FIG. 10, the Schmitt trigger circuit 320a may be triggered at a second low trigger level VTL2 when the voltage level of the first connection node NA falls from a VDD voltage level to a VSS voltage level and may be triggered at a second high trigger level VTH2 when the voltage level of the first connection node NA rises from a VSS voltage level to a VDD voltage level. Accordingly, the Schmitt trigger circuit 320a may have a second hysteresis width W2 between the second low trigger level VTL2 and the second high trigger level VTH2.

Fourth, when the voltage V(PAD1) of the first signal terminal 30 is higher than the third reference voltage Vm3 due to the influence of a strong ESD pulse voltage applied to the VDD rail 10 in the ESD monitoring circuit 120a, the first to third control signals DSC1, DSC2, and DSC3 may be output at a logic high level and the fourth to sixth control signals DSCB1, DSCB2, and DSCB3 may be output at a logic low level. Thus, the second to fourth branches 420, 430, and 440 may be disabled.

As shown in FIG. 10, due to the size of the second PMOS transistor P2 of the first branch 410 and the size of the third PMOS transistor P3, the Schmitt trigger circuit 320a may be triggered at a first low trigger level VTL1 when the voltage level of the first connection node NA falls from a VDD voltage level to a VSS voltage level and may be triggered at a first high trigger level VTH1 when the voltage level of the first connection node NA rises from a VSS voltage level to a VDD voltage level. Accordingly, the Schmitt trigger circuit 320a may have a first hysteresis width W1 between the first low trigger level VTL1 and the first high trigger level VTH1.

Referring to FIGS. 9 and 10, it may be seen that the Schmitt trigger circuit 320a has the first hysteresis width W1, which is the widest among the first to fourth hysteresis widths W1 to W4, when a strong ESD pulse voltage condition occurs on the VDD rail 10. A time period during which the NMOS transistor 332 of the switching circuit 330 (see FIG. 3) is turned on may increase in response to the longest logic high level pulse width of the second connection node NB corresponding to the first hysteresis width W1. Accordingly, a current corresponding to a strong ESD voltage applied to the VDD rail 10 may be sufficiently discharged to the VSS rail 20 during the longest logic high level pulse width of the second connection node NB.

Figure 11:
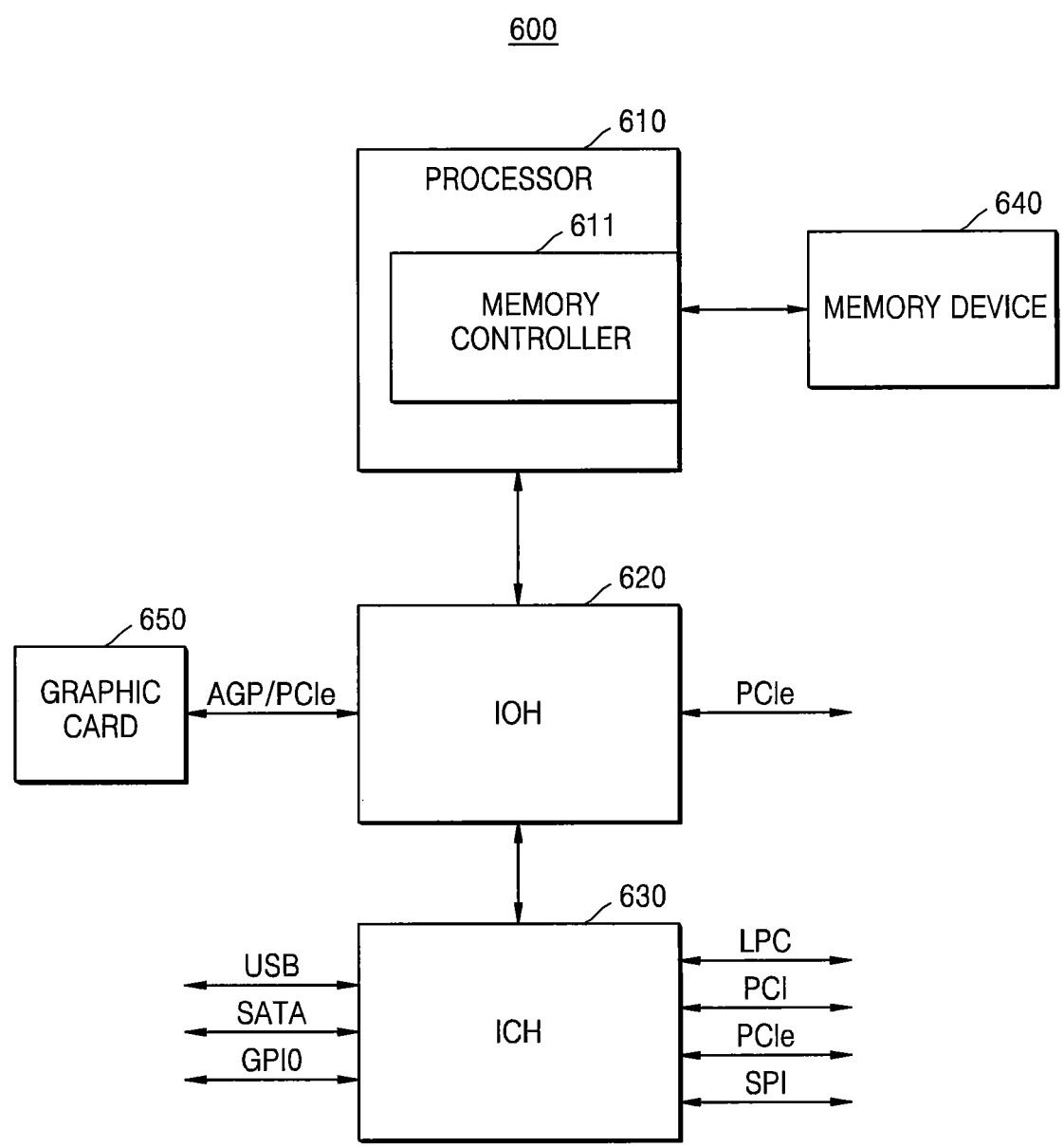
FIG. 11 is a block diagram illustrating an example in which a memory device including an ESD protection circuit having variable Schmitt trigger characteristics is applied to a computing system, according to some embodiments of the inventive concept.

FIG. 11 is a block diagram illustrating an example in which a memory device including an ESD protection circuit having variable Schmitt trigger characteristics is applied to a computing system 600, according to embodiments of the inventive concept.

Referring to FIG. 11, the computing system 600 includes a processor 610, an input/output hub 620, an input/output controller hub 630, a memory device 640, and a graphics card 650. According to some embodiments, the computing system 600 may be a computing system, such as a personal computer (PC), a server computer, a workstation, a laptop, a mobile phone, a smart phone, a personal digital assistant (PDA), a portable multimedia player (PMP), a digital camera, a digital television, a set-top box, a music player, a portable game console, and/or a navigation system.

The processor 610 may execute various computing functions, such as certain calculations or tasks. For example, the processor 610 may be a microprocessor or a central processing unit (CPU). According to some embodiments, the processor 610 may include a single processor core, i.e., a single core, or may include a plurality of processor cores, i.e., a multi-core. For example, the processor 610 may include a dual-core, a quad-core, a hexa-core, or the like. In FIG. 11, the computing system 600 including a single processor 610 is illustrated. However, according to some embodiments, the computing system 600 may include a plurality of processors. Also, according to some embodiments, the processor 610 may further include a cache memory located inside or outside the processor 610.

The processor 610 may include a memory controller 611 that controls the operation of the memory device 640. The memory controller 611 in the processor 610 may be referred to as an integrated memory controller (IMC). According to some embodiments, the memory controller 611 may be located in the input/output hub 620. The input/output hub 620 including the memory controller 611 may be referred to as a memory controller hub (MCH).

The memory device 640 may include an electrostatic protection circuit that protects an integrated circuit against overvoltage conditions. The electrostatic protection circuit may include a clamping circuit for detecting an overvoltage applied to a power supply rail, a Schmitt trigger circuit having variable trigger characteristics in response to a first control signal generated by an output of the clamping circuit and an overvoltage, and a switching circuit for discharging a current corresponding to the overvoltage to a ground rail in response to an output of the Schmitt trigger circuit. The Schmitt trigger circuit may include first and second branches bridged between the power supply rail and the ground rail. The Schmitt trigger circuit may operate with a narrow hysteresis width when the second branch is connected in parallel to the first branch and may operate with a wide hysteresis width when the second branch is not connected in parallel to the first branch. When a weak overvoltage is applied to the power supply rail, the memory device 640 may conduct between the power supply rail and the ground rail for a first pulse width to thereby discharge the overvoltage of the power supply rail. When a strong overvoltage is applied to the power supply rail, the memory device 640 may conduct between the power supply rail and the ground rail for a second pulse width longer than the first pulse width to thereby discharge the overvoltage of the power supply rail.

The input/output hub 620 may manage data transmission between the processor 610 and devices such as the graphics card 650. The input/output hub 620 may be connected to the processor 610 through various types of interfaces. For example, the input/output hub 620 and the processor 610 may be connected to each other through various standard interfaces, such as a Front Side Bus (FSB), a System Bus, a HyperTransport, a Lightning Data Transport (LDT), a QuickPath Interconnect (QPI), a common system interface, and a Peripheral Component Interface-Express (PCIe). In FIG. 11, the computing system 600 including one input/output hub 620 is illustrated. However, according to some embodiments, the computing system 600 may include a plurality of input/output hubs.

The input/output hub 620 may provide various interfaces with the devices. For example, the input/output hub 620 may provide an Accelerated Graphics Port (AGP) interface, a Peripheral Component Interface-Express (PCIe) interface, a Communications Streaming Architecture (CSA) interface, and the like.

The graphics card 650 may be connected to the input/output hub 620 through the AGP or the PCIe. The graphics card 650 may control a display device (not shown) for displaying an image. The graphics card 650 may include an internal processor for image data processing and an internal semiconductor memory. According to some embodiments, the input/output hub 620 may include a graphics device in the interior of the input/output hub 620 in place of the graphics card 650 located outside the input/output hub 620. The graphics device in the input/output hub 620 may be referred to as an integrated graphics device. In addition, the input/output hub 620 including a memory controller and a graphics device may be referred to as a Graphics and Memory Controller Hub (GMCH).

The input/output controller hub 630 may perform data buffering and interface arbitration so that various system interfaces operate efficiently. The input/output controller hub 630 may be connected to the input/output hub 620 through an internal bus. For example, the input/output hub 620 and the input/output controller hub 630 may be connected to each other through a Direct Media Interface (DMI), a hub interface, an Enterprise Southbridge Interface (ESI), a PCIe, or the like.

The input/output controller hub 630 may provide various interfaces with peripheral devices. For example, the input/output controller hub 630 may provide a Universal Serial Bus (USB) port, a Serial Advanced Technology Attachment (SATA) port, a General Purpose Input/Output (GPIO), a Low Pin Count (LPC) bus, a Serial Peripheral Interface (SPI), a PCI, a PCIe, and the like.

According to some embodiments, two or more components selected from the processor 610, the input/output hub 620, and the input/output controller hub 630 may be implemented as one chipset.

Figure 12:
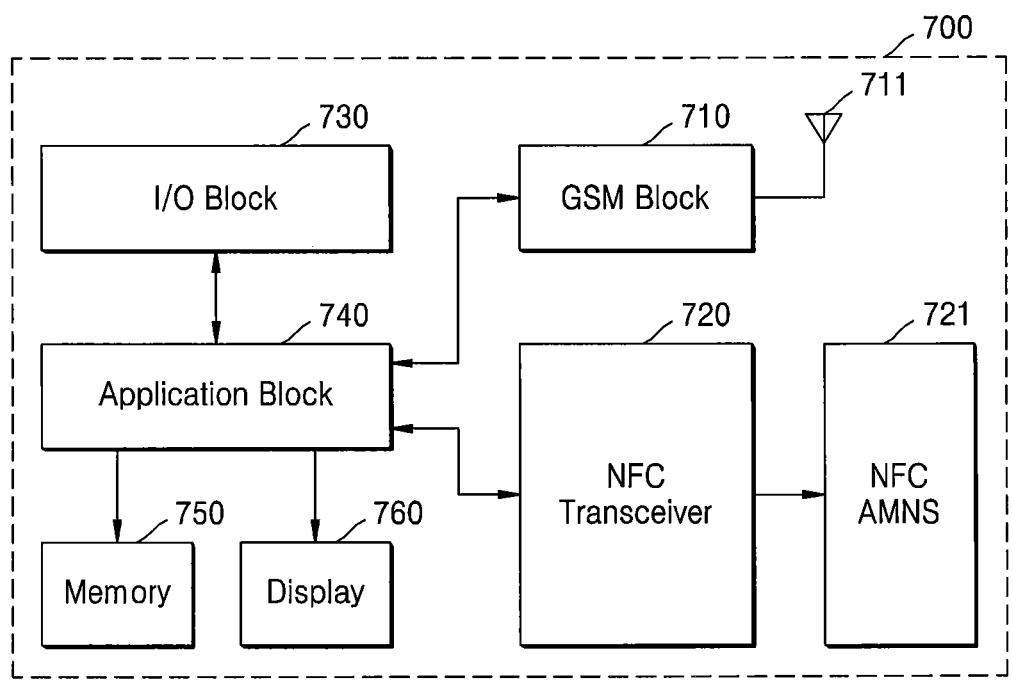
FIG. 12 is a block diagram illustrating an example in which a memory device including an ESD protection circuit having variable Schmitt trigger characteristics is applied to a mobile device, according to some embodiments of the inventive concept.

FIG. 12 is a block diagram illustrating example embodiments in which a memory device including an ESD protection circuit having variable Schmitt trigger characteristics is applied to a mobile device 700, according to embodiments of the inventive concept. The mobile device 700 may be a mobile phone or a smart phone.

Referring to FIG. 12, the mobile device 700 includes a Global System for Mobile communication (GSM) block 710, a Near Field Communication (NFC) transceiver 720, an input/output block 730, an application block 740, a memory 750, and a display 760. The components and blocks of the mobile device 700 in FIG. 12 are illustratively shown. The mobile device 700 may include more or fewer components and blocks. Also, while the mobile device 700 in the present embodiment uses GSM technology, the mobile device 700 may be implemented using other technologies such as Code Division Multiple Access (CDMA). The blocks of FIG. 12 may be implemented in the form of an integrated circuit. Alternatively, while some of the blocks may be implemented in the form of an integrated circuit, other blocks may be implemented in a separate form.

The GSM block 710 may be connected to an antenna 711 and be operated to provide a wireless telephone operation in a known manner. The GSM block 710 may internally include a receiver and a transmitter to perform reception and transmission operations.

The NFC transceiver 720 may be configured to transmit and receive NFC signals by using inductive coupling for wireless communication. The NFC transceiver 720 may provide NFC signals to an NFC antenna matching network system 721, and the NFC antenna matching network system 721 may transmit NFC signals through inductive coupling. The NFC antenna matching network system 721 may receive NFC signals provided from other NFC devices and provide the received NFC signals to the NFC transceiver 720.

The transmission and reception of NFC signals by the NFC transceiver 720 may be performed in a time-division manner. Thus, a time period over which the NFC transceiver 720 transmits NFC signals is referred to as a transmission interval, and a corresponding operational mode of the NFC transceiver 720 is considered as a transmission mode or an NFC reader transmission mode. Similarly, a time period during which the NFC transceiver 720 receives NFC signals is referred to as a reception interval, and a corresponding operational mode of the NFC transceiver 720 may be considered as a reception mode or an NFC tag reception mode.

The NFC transceiver 720 may operate in accordance with regulations described in the NFC Interface and Protocol-1 (NFCIP-1) and the NFC Interface and Protocol-2 (NFCIP-2) and standardized in ECMA-340, ISO/IEC 18092, ETSI TS 102 190, ISO 21481, ECMA 352, ETSI TS 102 312, and the like.

The application block 740 may include hardware circuits, e.g., one or more processors, and may operate to provide various user applications provided by the mobile device 700. User applications may include voice call operations, data transmission, data swapping, and the like. The application block 740 may operate in conjunction with the GSM block 710 and/or the NFC transceiver 720 to provide operating characteristics of the GSM block 710 and/or the NFC transceiver 720. In some embodiments, the application block 740 may include a program for mobile Point Of Sale (POS). Such a program may provide a credit card purchase and payment function using a mobile phone, i.e., a smart phone.

A display 760 may display an image in response to display signals received from the application block 740. An image may be provided by the application block 740 or may be generated by a camera embedded in the mobile device 700. The display 760 may include an internal frame buffer for temporary storage of pixel values and may be configured with associated control circuits and a liquid crystal display screen.

An input/output block 730 may provide an input function to users and provide outputs to be received via the application block 740.

A memory 750 may store programs (instructions) and/or data to be used by the application block 740 and may be implemented with RAM, a flash memory, a resistive memory, and the like. Thus, the memory 750 may include non-volatile storage elements as well as volatile storage elements. For example, the memory 750 may correspond to the semiconductor device 100 shown in FIG. 1.

The memory 750 may include an electrostatic protection circuit that protects an integrated circuit against overvoltage conditions. The electrostatic protection circuit may include a clamping circuit for detecting an overvoltage applied to a power supply rail, a Schmitt trigger circuit having variable trigger characteristics in response to a first control signal generated by an output of the clamping circuit and an overvoltage, and a switching circuit for discharging a current corresponding to the overvoltage to a ground rail in response to an output of the Schmitt trigger circuit. The Schmitt trigger circuit may include first and second branches bridged between the power supply rail and the ground rail. The Schmitt trigger circuit may operate with a narrow hysteresis width when the second branch is connected in parallel to the first branch and may operate with a wide hysteresis width when the second branch is not connected in parallel to the first branch. When a weak overvoltage is applied to the power supply rail, the memory 750 may conduct between the power supply rail and the ground rail for a first pulse width to thereby discharge the overvoltage of the power supply rail. When a strong overvoltage is applied to the power supply rail, the memory 750 may conduct between the power supply rail and the ground rail for a second pulse width longer than the first pulse width to thereby discharge the overvoltage of the power supply rail.

While the inventive concept has been particularly shown and described with reference to embodiments thereof, it will be understood that various changes in form and details may be made therein without departing from the spirit and scope of the following claims.

What is claimed is:

1. A method of protecting an integrated circuit against an overvoltage condition, the method comprising:
monitoring a voltage level of a signal terminal affected by the overvoltage condition applied to a power supply rail connected to the integrated circuit;
discharging the overvoltage condition of the power supply rail by conducting between the power supply rail and a ground rail connected to the integrated circuit for a first pulse width when the monitoring indicates that the voltage level of the signal terminal is equal to or less than a reference voltage; and
discharging the overvoltage condition of the power supply rail by conducting between the power supply rail and the ground rail connected to the integrated circuit for a second pulse width that is greater than the first pulse width when the monitoring indicates that the voltage level of the signal terminal exceeds the reference voltage.

2. The method of claim 1, wherein the discharging of the overvoltage condition of the power supply rail for the first pulse width or for the second pulse width comprises discharging a current corresponding to the overvoltage condition to the ground rail by using a Schmitt trigger circuit having variable trigger characteristics.

3. The method of claim 1, further comprising:
generating the reference voltage using a voltage divider connected between the power supply rail and the ground rail.

4. The method of claim 1,
wherein the integrated circuit is electrically connected to the power supply rail and the ground rail, and
wherein the signal terminal comprises one of a plurality of signal terminals associated with the integrated circuit.

5. The method of claim 1, wherein the signal terminal is separated from and electrically connected to the integrated circuit.

6. A Schmitt trigger circuit having variable trigger characteristics, the Schmitt trigger circuit comprising:
a first branch bridged between a power supply rail and a ground rail and connected between an input node and an output node;
a second branch bridged between the power supply rail and the ground rail and configured to be selectively connected between the input node and the output node in response to a first control signal;
a first PMOS transistor connected to a first connection node to which the first and second branches are connected, wherein the first PMOS transistor is configured to drive the first connection node to a ground voltage in response to a voltage level of the output node; and
a first NMOS transistor connected to a second connection node to which the first and second branches are connected, wherein the first NMOS transistor is configured to drive the second connection node to a power supply voltage in response to the voltage level of the output node,
wherein a hysteresis width of the Schmitt trigger circuit is variable responsive to the second branch being selectively connected in parallel to the first branch.

7. The Schmitt trigger circuit of claim 6,
wherein a first logic level of the first control signal configures the second branch to be connected in parallel to the first branch such that the Schmitt trigger circuit operates with a first hysteresis width, and
wherein a second logic level of the first control signal prevents the second branch from being connected in parallel to the first branch such that the Schmitt trigger circuit operates with a second hysteresis width that is greater than the first hysteresis width.

8. The Schmitt trigger circuit of claim 7, wherein the first control signal is at the first logic level when a relatively weak overvoltage is applied to the power supply rail and is at the second logic level when a relatively strong overvoltage is applied to the power supply rail.

9. The Schmitt trigger circuit of claim 7,
wherein the first hysteresis width represents a period between a first low trigger level and a first high trigger level which are between the power supply voltage level and the ground voltage level, and
wherein the Schmitt trigger circuit is triggered at the first low trigger level to transition a voltage of the output node from the ground voltage level to the power supply voltage level when a voltage of the input node decreases from the power supply voltage level to the ground voltage level, and is triggered at the first high trigger level to transition the voltage of the output node from the power supply voltage level to the ground voltage level when the voltage of the input node increases from the ground voltage level to the power supply voltage level.

10. The Schmitt trigger circuit of claim 9,
wherein the second hysteresis width represents a period between a second low trigger level and a second high trigger level which are between the power supply voltage level and the ground voltage level, and
wherein the second low trigger level is less than the first low trigger level and the second high trigger level is greater than the first high trigger level.

11. The Schmitt trigger circuit of claim 6, wherein the first branch comprises:
a second PMOS transistor connected between the power supply rail and the first connection node, the second PMOS transistor comprising a first gate connected to the input node;
a third PMOS transistor connected between the first connection node and the output node, the third PMOS transistor comprising a second gate connected to the input node;
a second NMOS transistor connected between the second connection node and the output node, the second NMOS transistor comprising a third gate connected to the input node; and
a third NMOS transistor connected between the ground rail and the second connection node, the third NMOS transistor comprising a fourth gate connected to the input node.

12. The Schmitt trigger circuit of claim 11, wherein the second branch comprises:
a fourth PMOS transistor connected between the power supply rail and the first connection node, the fourth PMOS transistor comprising a fifth gate connected to the first control signal;
a fifth PMOS transistor connected between the first connection node and the output node, the fifth PMOS transistor comprising a sixth gate connected to the input node;
a fourth NMOS transistor connected between the second connection node and the output node, the fourth NMOS transistor comprising a seventh gate connected to the input node; and
a fifth NMOS transistor connected between the ground rail and the second connection node, the fifth NMOS transistor comprising an eighth gate connected to an inverted signal of the first control signal.

13. The Schmitt trigger circuit of claim 6, further comprising:
a third branch bridged between the power supply rail and the ground rail and configured to be selectively connected between the input node and the output node in response to a second control signal,
wherein the hysteresis width of the Schmitt trigger circuit is reduced as the third branch is connected in parallel to the first and second branches.

14. The Schmitt trigger circuit of claim 13,
wherein the first and second control signals are generated by an overvoltage applied to the power supply rail, and
wherein, when the overvoltage is relatively weak, the second branch is configured to be disabled by the first control signal, and wherein, when the overvoltage is relatively strong, the second and third branches are configured to be disabled by the first and second control signals.

15. An electrostatic protection circuit comprising:
a clamping circuit connected between a power supply rail and a ground rail, wherein the clamping circuit is configured to detect an overvoltage applied to the power supply rail;
a Schmitt trigger circuit connected between the power supply rail and the ground rail and having variable trigger characteristics in response to a first control signal generated by an output of the clamping circuit and responsive to the overvoltage; and
a switching circuit connected between the power supply rail and the ground rail and configured to discharge a current corresponding to the overvoltage to the ground rail in response to an output of the Schmitt trigger circuit.

16. The electrostatic protection circuit of claim 15, wherein the Schmitt trigger circuit comprises:
a first branch bridged between the power supply rail and the ground rail;
a second branch bridged between the power supply rail and the ground rail, wherein the second branch is configured to be enabled in response to a first logic level of the first control signal and connected in parallel to the first branch, and is configured to be disabled in response to a second logic level of the first control signal and not connected in parallel to the first branch;
a first PMOS transistor connected to a first connection node to which the first and second branches are connected, the first PMOS transistor configured to drive the first connection node to a ground voltage in response to an output of the Schmitt trigger circuit; and
a first NMOS transistor connected to a second connection node to which the first and second branches are connected, the first NMOS transistor configured to drive the second connection node to a power supply voltage in response to the output of the Schmitt trigger circuit.

17. The electrostatic protection circuit of claim 16, wherein the Schmitt trigger circuit is configured to operate with a first hysteresis width when the first branch and the second branch are connected in parallel to each other and is configured to operate with a second hysteresis width greater than the first hysteresis width when the first branch and the second branch are not connected in parallel to each other.

18. The electrostatic protection circuit of claim 15, further comprising:
an overvoltage monitoring circuit configured to generate the first control signal when a voltage of a signal terminal affected by the overvoltage exceeds a first reference voltage,
wherein the overvoltage monitoring circuit comprises a comparator configured to generate the first control signal based on a comparison of the first reference voltage and the voltage of the signal terminal.

19. The electrostatic protection circuit of claim 18,
wherein the overvoltage monitoring circuit is further configured to generate a second control signal when the voltage of the signal terminal exceeds a second reference voltage that is higher than the first reference voltage, and
wherein the overvoltage monitoring circuit comprises an inverter that outputs the second control signal, responsive to the first control signal, and
wherein the first control signal and the second control signal have complementary signal levels.

20. The electrostatic protection circuit of claim 19,
wherein the Schmitt trigger circuit further comprises a third branch bridged between the power supply rail and the ground rail,
wherein the third branch is configured to be enabled in response to a first logic level of the second control signal and connected in parallel to the first branch, and is configured to be disabled in response to a second logic level of the second control signal and not connected in parallel to the first branch, and
wherein the hysteresis width of the Schmitt trigger circuit is reduced when the third branch is connected in parallel to the first and second branches.

* * * * *